United States Patent
Shibutani et al.

(10) Patent No.: US 9,315,919 B2
(45) Date of Patent: Apr. 19, 2016

(54) SCINTILLATOR PLATE AND RADIATION DETECTOR

(71) Applicant: CANON KABUSHIKI KAISHA, Tokyo (JP)

(72) Inventors: Yoshinori Shibutani, Tokyo (JP); Tamaki Kobayashi, Honjo (JP); Tomoyuki Oike, Yokohama (JP); Ryoko Ueyama, Yokohama (JP); Toru Den, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 114 days.

(21) Appl. No.: 14/338,562

(22) Filed: Jul. 23, 2014

(65) Prior Publication Data

US 2015/0034841 A1    Feb. 5, 2015

(30) Foreign Application Priority Data

Jul. 30, 2013  (JP) ................. 2013-157386

(51) Int. Cl.
| | |
|---|---|
| *G01T 1/00* | (2006.01) |
| *C30B 29/12* | (2006.01) |
| *G01T 1/202* | (2006.01) |
| *C30B 23/00* | (2006.01) |

(52) U.S. Cl.
CPC ............... *C30B 29/12* (2013.01); *C30B 23/00* (2013.01); *G01T 1/202* (2013.01)

(58) Field of Classification Search
CPC .......... C30B 29/12; C30B 23/00; G01T 1/202
See application file for complete search history.

(56) References Cited

U.S. PATENT DOCUMENTS

| | | | |
|---|---|---|---|
| 8,586,931 B2 | 11/2013 | Horie et al. | |
| 8,669,527 B2 | 3/2014 | Ueyama et al. | |
| 2014/0264044 A1 | 9/2014 | Kobayashi et al. | |

FOREIGN PATENT DOCUMENTS

| | | |
|---|---|---|
| JP | 3851547 B2 | 11/2006 |
| JP | 2013-14753 A | 1/2013 |
| JP | 2013-36030 A | 2/2013 |
| WO | 2012/169659 A1 | 12/2012 |

*Primary Examiner* — David Porta
*Assistant Examiner* — Edwin Gunberg
(74) *Attorney, Agent, or Firm* — Fitzpatrick, Cella, Harper & Scinto (57) ABSTRACT

Provided is a scintillator plate including a crystalline body formed of a compound having a crystal structure of a $Cs_3Cu_2I_5$ crystal and a substrate, in which an orientation of the crystalline body is an a-axis group orientation with respect to a direction perpendicular to the substrate.

5 Claims, 7 Drawing Sheets

SCINTILLATOR PLATE AND RADIATION DETECTOR

BACKGROUND OF THE INVENTION

1. Field of the Invention

The present invention relates to a scintillator plate and a radiation detector.

2. Description of the Related Art

In a flat panel detector (FPD) which is used in X-ray photography and the like in a medical site, a scintillator receives X-rays which have passed through an object, and a light-receiving element detects the light which has been emitted from the scintillator. Japanese Patent No. 3851547 describes a scintillator which is formed of CsI (cesium iodide)-CuI (copper iodide) mixed crystal body.

SUMMARY OF THE INVENTION

Provided is a scintillator plate including a crystalline body formed of a compound having a crystal structure of a $Cs_3Cu_2I_5$ crystal and a substrate, in which an orientation of the crystalline body is an a-axis group orientation with respect to a direction perpendicular to the substrate.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiment

Figure 1:
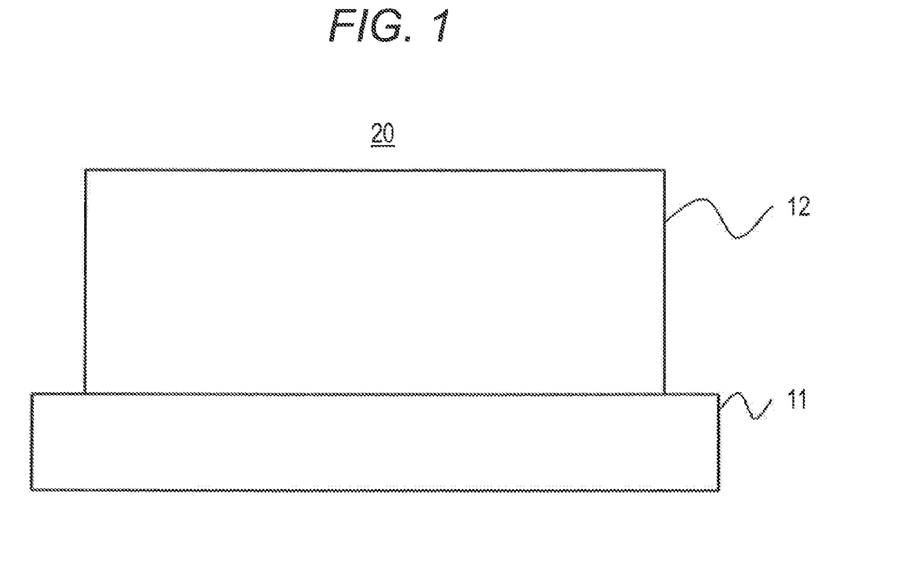
FIG. 1 is a view illustrating a schematic diagram of a cross section of a scintillator plate of an embodiment.

FIG. 1 illustrates one example of a schematic diagram of a cross section of a scintillator plate of the present embodiment. The scintillator plate 20 is provided with a substrate 11 and a scintillator film 12.

The scintillator film in the present embodiment contains a crystalline body formed from a compound having a crystal structure of $Cs_3Cu_2I_5$ crystal that is an iodine compound, in which the abundance ratio of the cesium element (Cs) and the copper element (Cu) is 3:2, and the crystalline body has an a-axis group orientation with respect to the substrate. Thereby, the above crystal can enhance a spatial resolution more than the CsI (cesium iodide)-CuI (copper iodide) mixed crystal body described in Japanese Patent No. 3851547. A crystalline body can be either mono crystalline or poly crystalline.

Firstly, the crystalline body formed of the compound having the crystal structure of the $Cs_3Cu_2I_5$ crystal that is the iodine compound will be described in detail below, which is the first point of the feature of the present embodiment.

The $Cs_3Cu_2I_5$ crystal which is the iodine compound has a complicated crystal structure different from that of each compound of cesium iodide and copper iodide. According to a PDF database number 01-072-9850 provided by ICDD (The International Centre for Diffraction Data), the unit lattice of the crystal structure is an orthorhombic crystal and belongs to a space group Pnma (No. 62), and the lattice constants are a=10.174 Å, b=11.653 Å, and c=14.362 Å. In addition, a diffraction angle, diffraction intensity and an index which are obtained by θ-2θ measurement in powder X-ray diffraction are described while being corresponded to each other, and coordinate locations of each element in the unit lattice are also already known. In the present specification and the present invention, even though being a compound other than the $Cs_3Cu_2I_5$ crystal, a compound which has the same crystal structure as the crystal structure of the $Cs_3Cu_2I_5$ crystal is referred to as a compound having the crystal structure of the $Cs_3Cu_2I_5$ crystal. In addition, the crystal structure of this $Cs_3Cu_2I_5$ crystal which is the iodine compound shall be referred to as "325 structure". In addition, in the powder X-ray diffraction, the Kα1 ray (having wavelength of 1.5406 Å) of the Cu element shall be used as X-rays.

It can be identified whether the compound having received attention has the 325 structure or not, by the comparison of a diffraction profile obtained by subjecting the compound to the θ-2θ measurement in the powder X-ray diffraction, with the above described database. Specifically, when each of the values in the diffraction angle 2θ obtained by the above described measurement for only a single compound exists in a range of ±0.5 degrees or less around each of the values in the diffraction angles on the above described database, it can be said that the crystal structure of the measured single compound has the 325 structure. However, each of the values in the diffraction angle 2θ is limited to a value existing in a range of 10 degrees or more and 40 degrees or less. In the above described measurement, the diffraction angle needs to be already calibrated.

In the case where a sample is desired to be measured in a state in which only the compound having received attention cannot be isolated and another compound or a plurality of other compounds are mixed thereto, all the values of the diffraction angles originating in the another compound or the plurality of other compounds are excluded, and if the values of the remaining diffraction angles exist in the above described ranges, respectively, it can be said that the compound having received attention has the 325 structure.

Even in the case where the diffraction angle which has been obtained by actual measurement does not exist in the range of ±0.5 degrees of the diffraction angle on the database, it can be considered that the compound has the 325 structure if the compound satisfies the following two features. One feature is that a desired compound is a uniform solid. Second feature is that in a composition of the desired compound, an abundance ratio of elements of (total alkali metal element):(Cu element, Ag element and Au element):(total halogen element) falls within a range of (0.6±0.1):(0.4±0.1):1. Examples of the compounds which satisfy these two features include, for instance, a compound in which the abundance ratio of Cs element:Cu element:I element is not strictly 3:2:5, and a compound in which an element exists in a position between crystal lattices. In addition, other examples include a compound having such a composition that a part or all of the Cs elements in the $Cs_3Cu_2I_5$ crystal are replaced with another alkali metal element, a compound having such a composition that a part or all of the iodine elements are replaced with another halogen element, and a compound having such a composition that a part or all of the Cu elements are replaced with the Ag element or the Au element. Further another example includes a compound in which a trace amount of another element is added to the $Cs_3Cu_2I_5$ crystal. In addition, as long as the compound simultaneously satisfies the above described two features, the compound can maintain the 325 structure even when the compound satisfies only a part or all of the examples out of the above described examples. Even though being a part of the Cs elements in the $Cs_3Cu_2I_5$ crystal is replaced with another alkali metal element, and a trace amount of another element is added to the $Cs_3Cu_2I_5$ crystal, for instance, the compound is considered to have the 325 structure as long as the compound simultaneously satisfies the above described two features.

The compound having the 325 structure absorbs X-rays, shows an excitonic emission originating in the structure, emits visible light having emission wavelengths from 300 nm to the vicinity of 800 nm, and accordingly is useful as a material of a scintillator which detects the X-rays. In addition, a trace amount of the element of Ag, Au, In, Tl, Bi, Ce, Pr, Nd, Pm, Sm, Eu, Gd, Tb, Dy, Ho, Er, Tm or Yb may be added as the center of the light emission, and in that case, the light emission can occur which originates in the 325 structure or originates in the added element.

Furthermore, these compounds having the 325 structure are different from cesium iodide which is a general material for the scintillator, and have resistance to deliquescence. Because of this, a shape and a form of the compound, which have been formed once, resist deteriorating with time, and accordingly a performance such as emission intensity and resolution deteriorates little.

The second point of the features of the present embodiment includes that the crystalline body has the a-axis group orientation with respect to a direction perpendicular to the substrate. Incidentally, in the present invention and the present specification, the a-axis group orientation means that a value of "ratio of a/b axis group" is 2.7 or more. The above meaning will be described in detail below.

In the above described database of the $Cs_3Cu_2I_5$ crystal having the 325 structure, the diffraction angle, the diffraction intensity and the index obtained by the θ-2θ measurement in the powder X-ray diffraction are described while being previously corresponded to each other. A set of crystals of which the indices in this database are 200, 301, 311, 400 and 401 is defined as an a-axis orientation group. Similarly, a set of crystals of which the indices are 020, 031, 131 and 040 is defined as a b-axis orientation group. In addition, a ratio (Ia/Ib) of the sum (Ia) of values of the diffraction peak intensity in the a-axis orientation group with respect to the sum (Ib) of values of the diffraction peak intensity in the b-axis orientation group is defined as "ratio of a/b axis group".

The values of the diffraction angle 2θ for the a-axis orientation group described in the above described database include diffraction angles of 17.42 degrees with respect to the index 200, 26.99 degrees with respect to the index 301, 28.07 degrees with respect to the index 311, 35.26 degrees with respect to the index 400, and 35.82 degrees with respect to the index 401. The values of the b-axis orientation group similarly include diffraction angles of 15.19 degrees with respect to the index 020, 23.71 degrees with respect to the index 031, 25.29 degrees with respect to the index 131, and 30.66 degrees with respect to the index 040. If each of the diffraction angles which have been obtained by the actual measurement falls within a range of ±0.5 degrees of the diffraction angle in the above described database, the value of the diffraction peak intensity obtained by the actual measurement with respect to the diffraction angle can be corresponded to the index. The ratio of the a/b axis group can be obtained from the above operation. Here, when there is no particular axis orientation, the value of the ratio is 0.98 based on the database.

On the other hand, as a result of extensive investigations, the present inventors have found out that among crystals having the 325 structure, a crystal which has the a-axis group orientation, specifically, has the value of the ratio of the a/b axis group of 2.7 or more, shows a high value of the MTF compared to a crystal which does not have the a-axis group orientation, specifically, has the value of the ratio of the a/b axis group of less than 2.7. In addition, the present inventors have also found out that a crystal having the structure of the a-axis orientation shows high MTF regardless of the film thickness.

Figure 2:
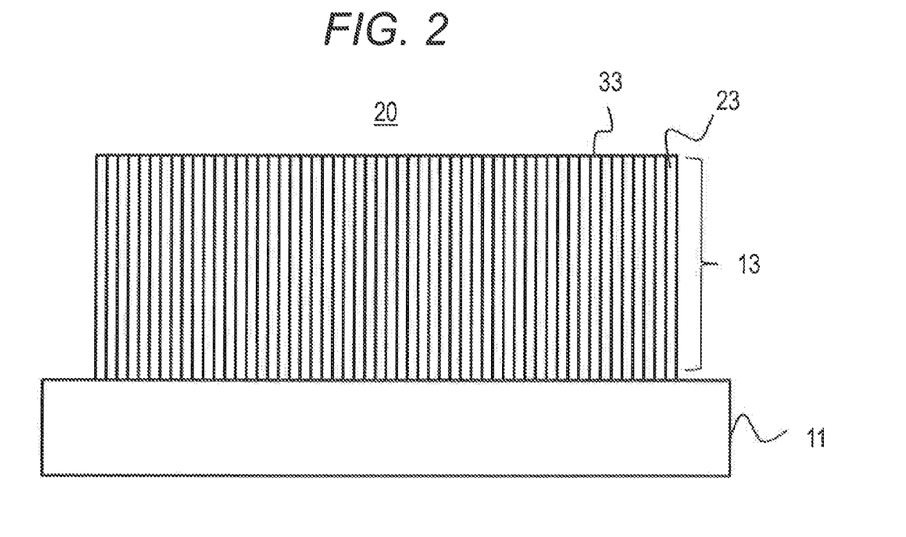
FIG. 2 is a view illustrating a schematic diagram of a cross section of a scintillator plate (columnar structure) of the embodiment.
Figure 10:
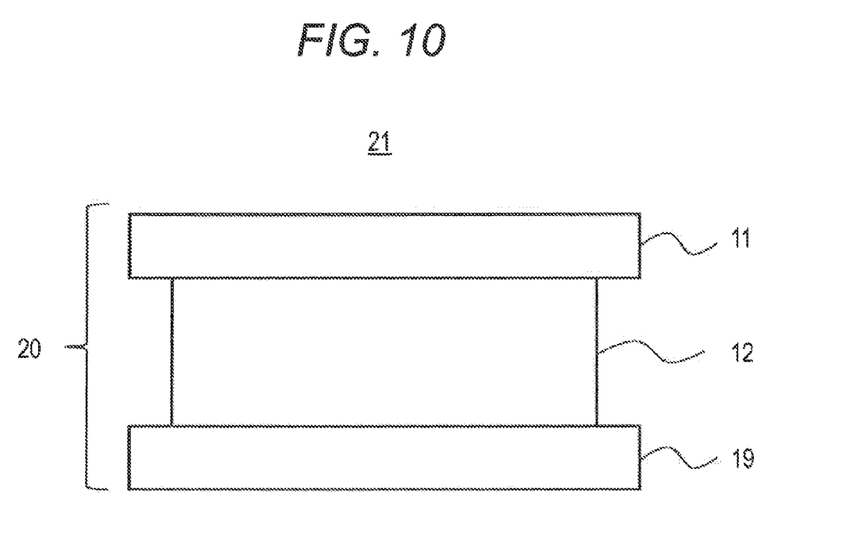
FIG. 10 is a schematic diagram of a cross section of a radiation detector which is provided with the scintillator plate of the embodiment.

One reason why the resolution is enhanced in the case of the a-axis group orientation is because a film structure of a scintillator film having the a-axis group orientation tends to have such a columnar structure as to head for a direction perpendicular to the substrate. The columnar structure means a structure in which a plurality of columnar crystalline bodies (hereinafter referred to simply as columnar crystal) are collectively formed into a bundle, and a schematic diagram of such a scintillator film and a substrate is illustrated in FIG. 2. When the scintillator film has such a columnar structure that a plurality of columnar crystalline bodies 23 are collectively formed into the bundle, as in the scintillator film 13 in FIG. 2, there is such a tendency that a large number of optical interfaces are formed which include directions perpendicular to or directions nearly perpendicular to the substrate 11. Many of scintillation lights which have been generated in the crystal repeat total reflection or a strong Fresnel reflection phenomenon due to the large number of these optical interfaces, are guided in a direction perpendicular to an X-ray entrance surface (hereinafter referred to as film surface) 33, and can be efficiently received by a light-receiving element which is positioned in the vicinity right under a light-emitting point. Specifically, the columnar structure can suppress the spread of the scintillation lights which head for in-plane directions of the film, and accordingly has an effect of enhancing the resolution of the scintillator plate 20. In addition, when such a scintillator plate 20 is combined with a photodetector 19 to constitute a radiation detector 21, as is illustrated in FIG. 10, the columnar structure can also enhance the resolution of the radiation detector. Incidentally, the photodetector can be a photodetector which can detect the intensity of light emitted from position to position of the scintillator plate. For instance, a solid-state imaging device can be used in which pixels that detect the intensity of the light are two-dimensionally arrayed. When the scintillator film has the columnar structure, the pixel size can be the width of the columnar crystal or more, which the columnar structure has, and further can be twice of the width of the columnar crystal or more. On the other hand, the plurality of columnar crystals can be arranged on one pixel. This is because when the plurality of columnar crystals is arranged on one pixel, the light which has leaked from one columnar crystal can be guided in the close columnar crystal.

Figure 3:
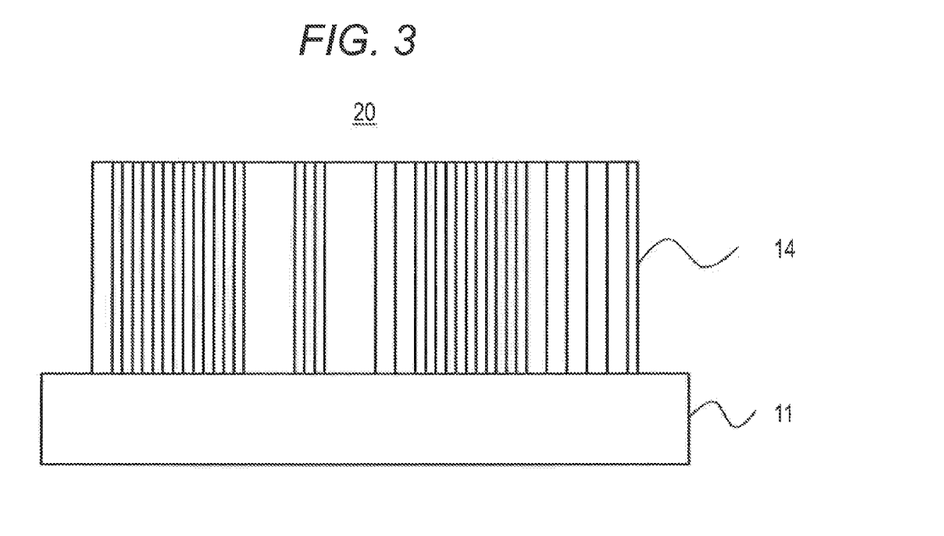
FIG. 3 is a schematic diagram of a cross section of a scintillator plate (in which column diameters are different) of the embodiment.
Figure 5:
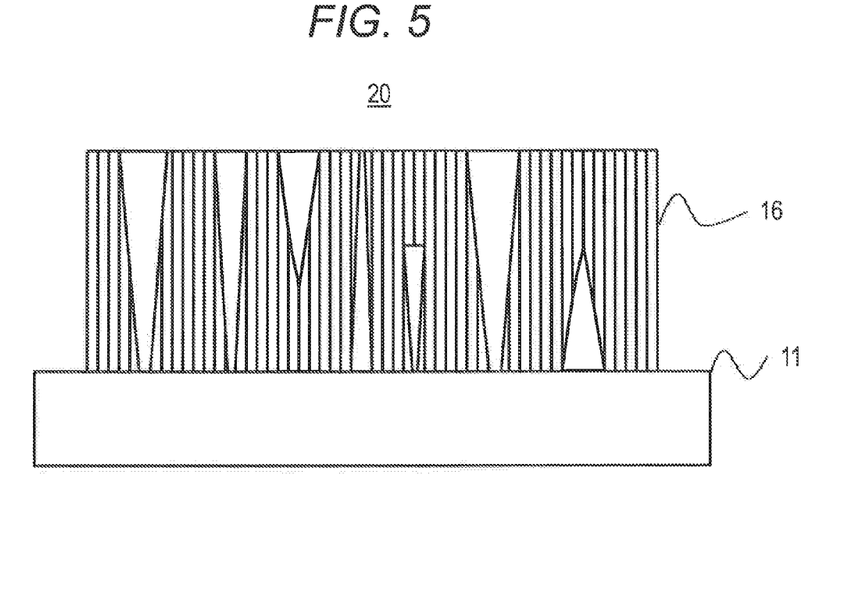
FIG. 5 is a schematic diagram of a cross section of a substrate and a scintillator plate (in which column diameter changes) of the embodiment in the present invention.

Here, the width of the columnar crystalline body does not necessarily need to be uniform, and columnar crystalline bodies having different widths may be simultaneously contained in the scintillator film, as in the scintillator film 14 in FIG. 3. In the case, a relationship between the average value of the widths of the columnar crystalline bodies and the pixel size can satisfy the above described relationship. In addition, the width of each of the columnar crystalline bodies can be 0.01 μm or more and 50 μm or less, and further can be 0.1 μm or more and 15 μm or less. In addition, as in the scintillator film 16 in FIG. 5, the widths from one end to the other end of the columnar crystalline body having received attention may change within a range of 0.01 μm or more and 50 μm or less.

When the width is less than 0.01 μm, the diameter becomes considerably smaller than the wavelength of the light, and accordingly it becomes difficult for the light to be geometrically-diffracted and/or optically-scattered. Because of this, the light results in widely propagating in the film, and becomes a factor of lowering the resolution. On the other hand, when the width is larger than 50 μm, a part of the light which has not caused the total reflection leaks from the columnar crystalline body having received attention toward an adjacent columnar crystalline body, and most of the leaked lights results in being received by the light-receiving element through the adjacent columnar crystalline body. Accordingly, the light results in easily spreading to a region which has a radius of three times as long as the width, specifically, a radius of 150 μm or more. The fact becomes a factor of lowering the resolution not only in a high spatial frequency (10 LP/mm) but also in a low spatial frequency (2 LP/mm).

Figure 4:
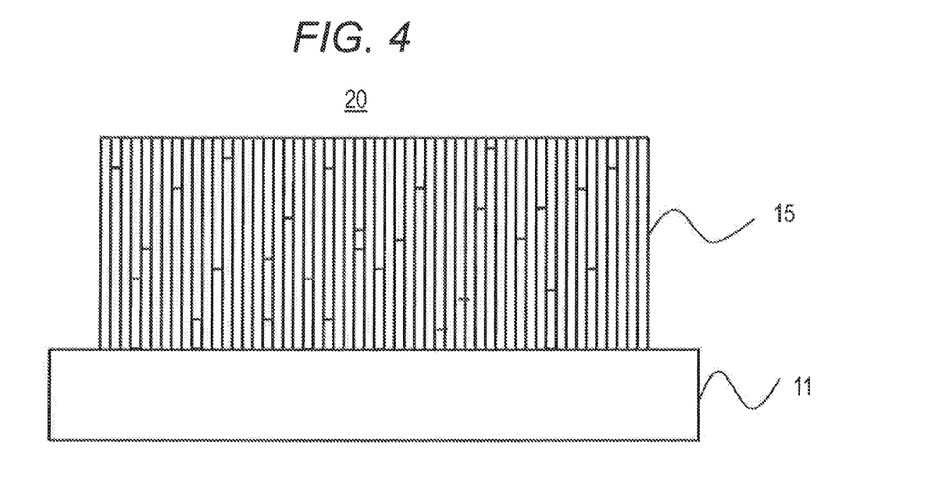
FIG. 4 is a schematic diagram of a cross section of a scintillator plate (in which lengths of columns are different) of the embodiment.

The length of each of the columnar crystalline bodies which constitute the scintillator film is equivalent to the film thickness of the scintillator, and all the lengths can be uniform. However, the length does not necessarily need to be uniform, and long and short columnar crystalline bodies may be simultaneously contained in the same scintillator film, as in the scintillator film 15 of FIG. 4. The reason is because even though there is the scintillation light which has leaked from the end of the short columnar crystal buried in the scintillator film, the light enters into the inside of the adjacent long columnar crystal, is guided in the columnar crystal in the state, and heads for the light-receiving element right under the columnar crystal. Accordingly, it can be said that a state in which the long and short columnar crystalline bodies coexist gives little influence on the capability of suppressing the spread of the light.

The film thickness of the scintillator does not exert a great influence on the effect of the present embodiment. Even though being thin or thick, the scintillator film shows a sufficient effect, but in consideration of a practical production process, the film thickness is 1 nm or more and 10 cm or less. The film thickness can be further 1 μm or more and 1 cm or less.

Figure 6:
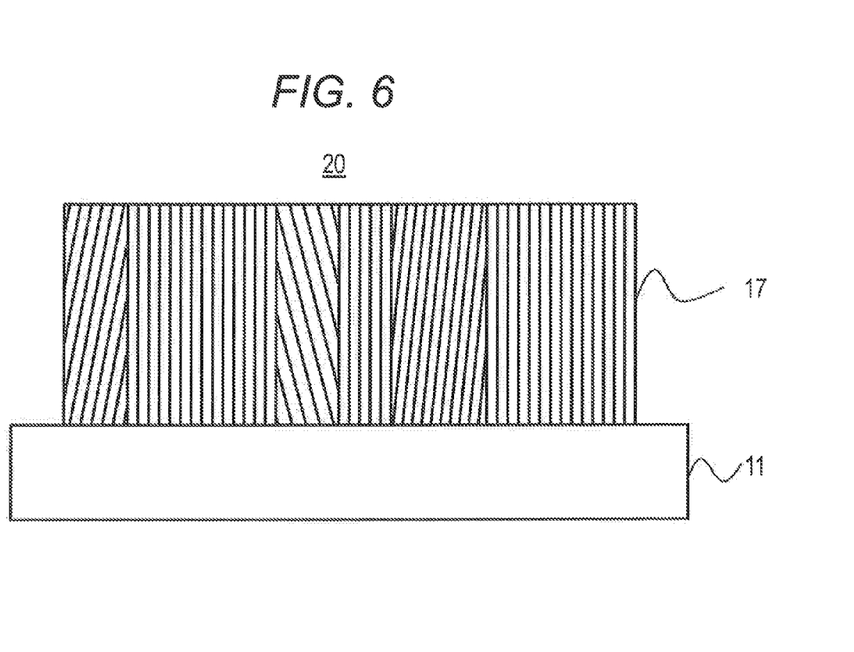
FIG. 6 is a schematic diagram of a cross section of a substrate and a scintillator plate (in which inclinations of columns are different) of the embodiment in the present invention.
Figure 7:
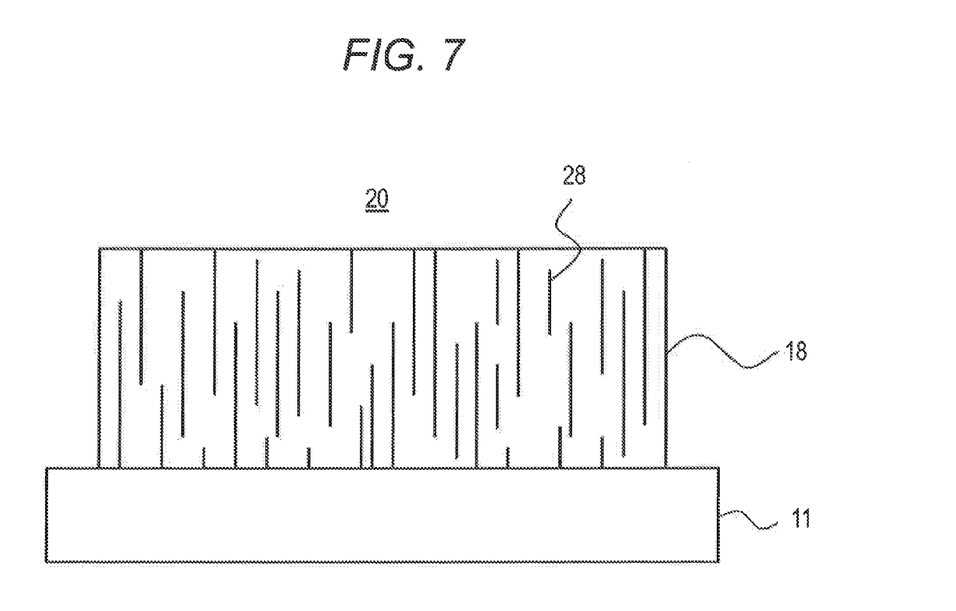
FIG. 7 is a schematic diagram of a cross section of a substrate and a plate (in which optical interface dissipates) of the embodiment in the present invention.

The columnar crystalline bodies do not necessarily need to be strictly perpendicular to the film surface of the scintillator film, but may incline or may not uniformly incline to each other, as in the scintillator film 17 in FIG. 6. In addition, as in the scintillator film 18 in FIG. 7, the scintillator film may be a scintillator film in which each of the columnar crystalline bodies are not completely isolated from each other, and optical interfaces 28 intermittently exist which have directions nearly perpendicular to the film surface.

As a method for producing the scintillator plate of the present embodiment, a general heating vapor-deposition method, for instance, can be used. The heating vapor-deposition method is a technique of heating a raw powder of the scintillator and thereby vaporizing the raw powder to form a scintillator film on a substrate which is positioned so as to face the raw powder, in a vacuum chamber. Methods of heating the raw powder of the scintillator include a resistance heating type with the use of a metal boat, a crucible heating type and an electron beam heating type.

As for the raw powder of the scintillator, the CsI powder and the CuI powder are mixed so that the respective compositions become 3:2, a container is filled with the mixed powder, and the mixed powder is vapor-deposited on a substrate. Alternatively, it is acceptable to fill individual containers with the CsI powder and the CuI powder, respectively, and to deposit the vapor on the substrate while controlling individual vapor-deposition rates so that the compositions of CsI and CuI in the whole film become 3:2. Alternatively, it is also acceptable to fill a container with a powder of a $Cs_3Cu_2I_5$ compound, and deposit the vapor on the substrate. At this time, it is acceptable to mix a plurality of powder materials which are the same as or different from the above described powder, and deposit the vapor on the substrate, or deposit the vapor evaporated from a container different from the above described container on the substrate at the same time. In addition, a scintillator film having a crystal formed of a compound which has other elements can be similarly produced. For instance, if the CsI powder and the AgI powder are mixed so that the respective compositions become 3:2 and the mixture is vapor-deposited on a substrate, a scintillator film having the $Cs_3Ag_2I_5$ crystal can be produced. In addition, if the CsI powder, the CuI powder and the AgI powder are mixed so that the respective compositions become 3:1:1 and the mixture is vapor-deposited on a substrate, a crystal can be produced in which a part (half) of Cu in the $Cs_3Cu_2I_5$ crystal is replaced with Ag.

An atmospheric pressure at the time when a raw material is vapor-deposited on the substrate in the inside of the vacuum chamber can be controlled to be constant, by controlling the inside of the container with a vacuum pump or by introducing an inert gas into the container while degassing the inside of the container with the vacuum pump. A desirable atmospheric pressure can be appropriately determined according to a distance between a vaporizing point of the raw material and a point to be vapor-deposited on the substrate, but when the distance is 120 mm, for instance, the atmospheric pressure can be $10^{-5}$ Pa or more and 10 Pa or less, and further can be 0.5 Pa or more and 5 Pa or less. When the raw material is vapor-deposited on the substrate at this atmospheric pressure, the a-axis group orientation tends to be easily achieved. This reason is assumed to be the followings. Scattering of molecules of the raw material occur due to the atom or molecule of the atmospheric gas, and as a result, a kinetic energy of particles of the raw material is lowered, which are incident on the substrate, and accordingly a diffusion length of the particles becomes short. The atmospheric pressure has an effect of thereby covering the top surface of the columnar crystal which is the surface of the film, with a plane having lower surface energy. In the case of a compound having the 325 structure, if it is considered that the surface energy of a surface perpendicular to the a-axis is lower than that of the b-axis, it is considered that the a-axis becomes easy to head for a direction perpendicular to the top surface of the columnar crystal, and as a result, the a-axis group orientation is easily achieved. The reason why the value of "ratio of a/b axis group" greatly changes is also considered to be similar to the above described description. Specifically, it is considered that a scattering effect due to the atmospheric gas starts appearing in the vicinity of 0.5 Pa, and the effect becomes remarkable in the vicinity of 2.5 Pa; but that the scattering effect becomes excessively strong in the vicinity of 5 Pa, and accordingly the whole film becomes porous and a-axis orientability results in being weakened to some extent. It may be considered that the distance and the atmospheric pressure form an approximately inversely proportional relationship. Accordingly, when the distance is, for instance, twice (240 mm) of the above described distance, the atmospheric pressure can be further 0.25 Pa or more and 2.5 Pa or less. In addition, even though the atmospheric pressure has changed during the vapor deposition, the atmospheric pressure is not cared, and when the atmospheric pressure changes within the above described range, the change gives little influence on the a-axis orientability when the present invention is carried out.

The temperature of the substrate during the vapor deposition is within a range of 50° C. to 250° C., and further can be 100° C. to 200° C. It is desirable that the temperature of the substrate is kept constant during the vapor deposition, but the temperature may change in a range of 50° C. to 250° C. during the vapor deposition, and the temperature gives little influence on the a-axis orientability when the present invention is carried out.

The heating vapor-deposition method has been quoted as a method of producing the scintillator film of the present embodiment, but it is acceptable to adopt a sputtering method, a CVD method and a deposition method using an ink jet process, as an alternative method of the heating vapor-deposition method. The effect of the present invention is revealed as long as such a scintillator film is formed as to satisfy that the scintillator film contains a crystalline body formed of the compound having the 325 structure and has the a-axis group orientation with respect to a direction perpendicular to the substrate.

An example of the present invention will be described below. However, the present invention is not limited to the example.

EXAMPLE

A heating vapor-deposition method was used for producing the scintillator film. A heating crucible in a vacuum chamber was filled with a raw powder prepared by mixing a cesium iodide powder and a copper iodide power so that the respective compositions become 3:2. An Si substrate was employed as a substrate, which was arranged so as to face the crucible, and was mounted on a turntable that could control a substrate temperature. In addition, a distance between an upper end of the crucible and the substrate was set at 120 mm. The inside of the vacuum chamber was set at a high vacuum state of $1 \times 10^{-3}$ Pa or less with a vacuum pump, a crucible temperature was set at 630° C. and a substrate temperature was set at 140° C., temporarily. Here, when the samples 2, 4 and 5 were produced, another crucible than the above described crucible was arranged in the chamber, the crucible was filled with a raw powder of thallium iodide which functioned as a light-emitting center, and a crucible temperature was set at 340° C. Thus, the raw material powder was used for simultaneous film formation. An ambient pressure in the chamber was controlled by an introduction of Ar gas into the vacuum chamber. However, in the samples 1 to 3, the ambient pressures were all controlled so as to be 15 Pa, and in the samples 4 to 7, the ambient pressures were controlled so as to be sequentially 0.5 Pa, 5 Pa, 2.4 Pa and 2.5 Pa. In all of the samples, the substrate temperature was set at 100° C., and a film of the raw material was formed on the Si substrate while the substrate was rotated at 3 rpm. The obtained samples were subjected to the observation of the cross section by SEM, and further to θ-2θ measurement by X-ray diffraction and MTF evaluation (resolution evaluation) by X-ray irradiation.

A process in the MTF evaluation will be described below. The MTF was evaluated by an edge method which is general as a technique of evaluating the resolution. As for a radiation quality of the used X-rays, tungsten was used as a radiation source, a tube voltage was set at 60 kV, a tube current was set at 1 mA, the X-rays were transmitted through a sheet-like aluminum filter having a thickness of 3 mm, and the transmitted X-rays were used as the radiation quality of the used X-rays for the evaluation. A scintillator sample was subjected to the MTF measurement of pressing the scintillator sample toward a CCD provided with a FOP, and irradiating the scintillator sample with the radiation quality of the X-rays for the evaluation.

Figure 8:
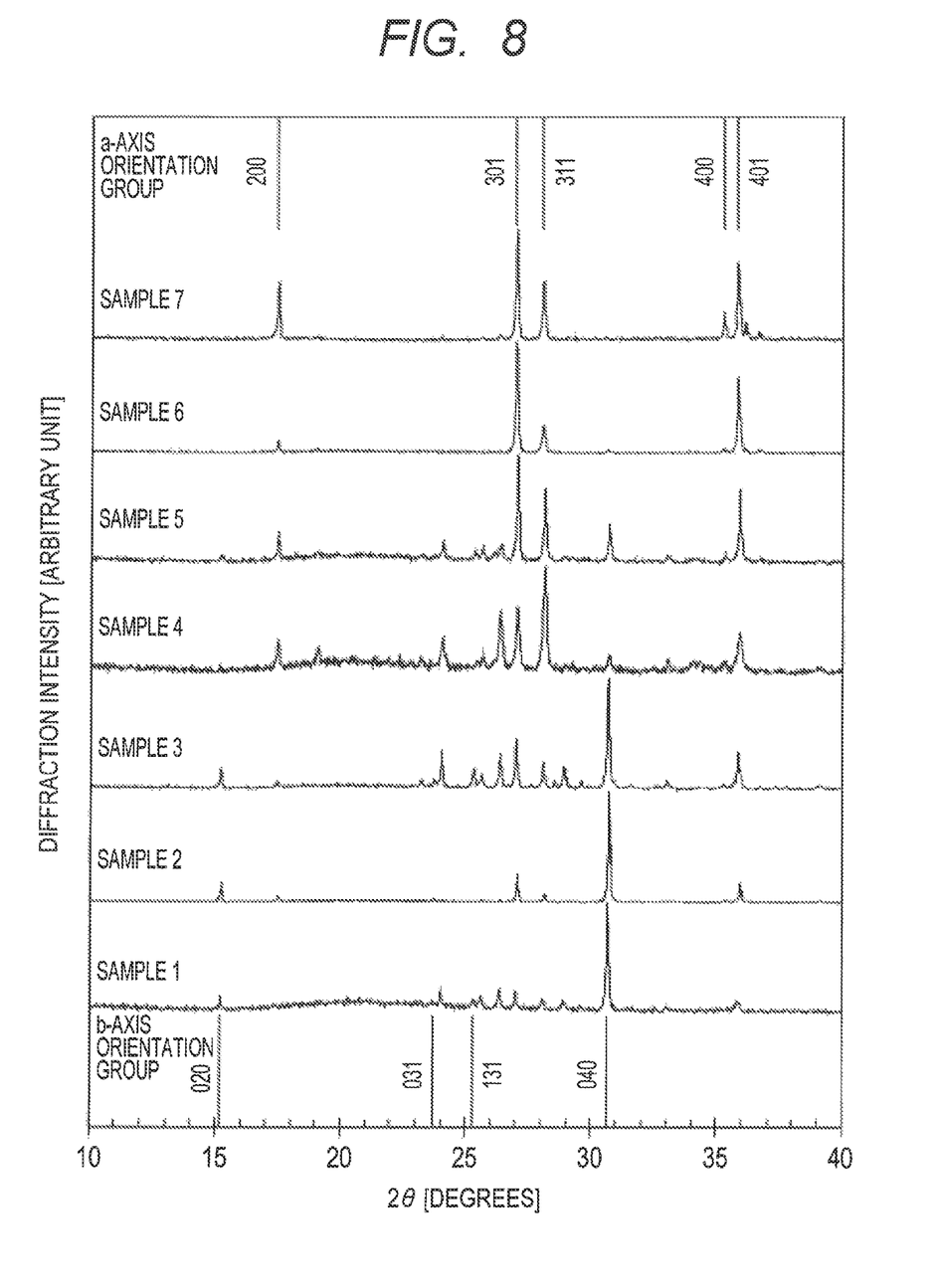
FIG. 8 is a view illustrating X-ray diffraction profiles of scintillator plates of Comparative Examples and Examples.
Figure 9:
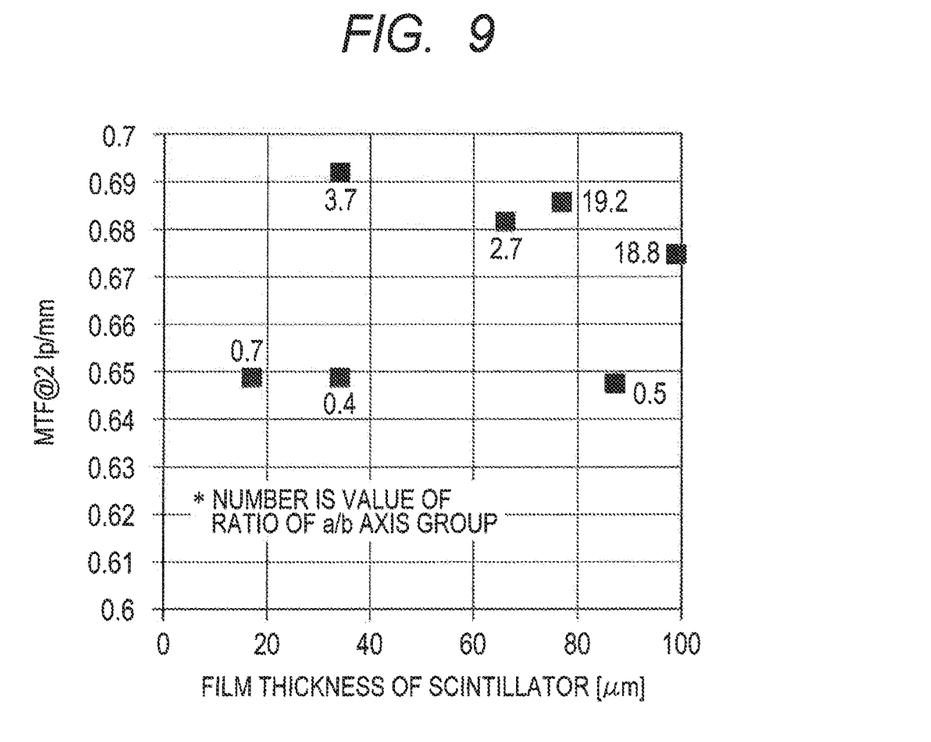
FIG. 9 is a view illustrating a dependency of MTF on a film thickness of the scintillator plate of the embodiment in the Comparative Examples and the Examples.

FIG. 8 illustrates a diffraction profile of every sample, which was obtained by subjecting the sample to the θ-2θ measurement by X-ray diffraction in a plane perpendicular to a film surface, in other words, in the out-of-plane. In a result of the X-ray diffraction, the samples 1 to 3 are Comparative Examples, and the samples 4 to 7 are Examples of the present invention. It could be confirmed that all diffraction lines which appeared in the diffraction profiles in all of the samples belonged to the above described database. Accordingly, it was proved that all of the samples were formed of the compound having the 325 structure. It is understood that, in the samples 1 to 3, the diffraction intensities of the b-axis orientation group are relatively intense, and in the samples 4 to 7, the diffraction intensities of the a-axis orientation group are relatively intense. Table 1 shows values (at 2 Lp/mm) of MTF which is one of indices that show the resolution, and ratios of an a/b axis group of each sample. In addition, FIG. 9 illustrates a correlation between the values of the MTF and the film thicknesses of the scintillators of the samples 1 to 7. From Table 1 and FIG. 9, it was found that the samples 4 to 7 of which the values of the ratios of the a/b axis group were 2.7 or more had high values of the MTF compared to the samples 1 to 3 of which the values of the ratios of the a/b axis group were less than 2.7. As described above, the embodiment was achieved by the present example and the effect of the present embodiment could be proved.

TABLE 1

| Sample | Film thickness of scintillator [um] | MTF (2 lp/mm) | Ratio of a/b axis group | Remark |
| --- | --- | --- | --- | --- |
| 1 | 34 | 0.649 | 0.4 | Comparative Example |
| 2 | 87 | 0.648 | 0.5 | Comparative Example |
| 3 | 17 | 0.649 | 0.7 | Comparative Example |
| 4 | 66 | 0.682 | 2.7 | Example |
| 5 | 34 | 0.692 | 3.7 | Example |
| 6 | 99 | 0.675 | 18.8 | Example |
| 7 | 77 | 0.686 | 19.2 | Example |

As described above, it was shown that the scintillator film which contains the crystalline body formed of the compound having the 325 structure enhanced the resolution, in the case where the value of the ratio of the a/b axis group was 2.7 or more, in other words, the scintillator film had the a-axis group orientation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-157386, filed Jul. 30, 2013, which is hereby incorporated by reference herein in its entirety.

What is claimed is:

1. A scintillator plate comprising a crystalline body formed of a compound having a crystal structure of a $Cs_3Cu_2I_5$ crystal and a substrate, wherein an orientation of the crystalline body is an a-axis group orientation with respect to a direction perpendicular to the substrate.

2. The scintillator plate according to claim 1, wherein the crystalline body has columnar structure.

3. The scintillator plate according to claim 2, wherein the columnar structure comprises a columnar crystalline body of which width is 0.01 μm or more and 50 μm or less.

4. A radiation detector provided with the scintillator plate according to claim 1, and with a photodetector.

5. The radiation detector according to claim 4, wherein a crystalline body has columnar structure, further wherein the radiation detector has a pixel of which size is larger than a width of each of the columnar crystalline body.

* * * * *